US009337275B2

(12) United States Patent
Ruhl et al.

(10) Patent No.: US 9,337,275 B2
(45) Date of Patent: May 10, 2016

(54) ELECTRICAL CONTACT FOR GRAPHENE PART

(71) Applicant: Infineon Technologies AG, Neubiberg (DE)

(72) Inventors: Guenther Ruhl, Regensburg (DE); Raimund Foerg, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/166,553

(22) Filed: Jan. 28, 2014

(65) Prior Publication Data

US 2015/0214303 A1  Jul. 30, 2015

(51) Int. Cl.
| | | |
|---|---|---|
| *H01L 21/8232* | (2006.01) | |
| *H01L 29/16* | (2006.01) | |
| *H01L 29/45* | (2006.01) | |
| *H01L 21/285* | (2006.01) | |
| *H01L 29/66* | (2006.01) | |

(52) U.S. Cl.
CPC ...... *H01L 29/1606* (2013.01); *H01L 21/28518* (2013.01); *H01L 21/28556* (2013.01); *H01L 29/45* (2013.01); *H01L 29/66015* (2013.01)

(58) Field of Classification Search
CPC . H01L 21/335; H01L 21/8232; H01L 29/785; H01L 29/66795; H01L 29/517
USPC ..................................... 257/741; 438/14, 610
See application file for complete search history.

(56) References Cited

U.S. PATENT DOCUMENTS

| | | | | |
|---|---|---|---|---|
| 2010/0163285 | A1* | 7/2010 | Marinero | 174/257 |
| 2012/0132885 | A1* | 5/2012 | Lippert | B82Y 10/00 257/9 |
| 2013/0099205 | A1* | 4/2013 | Liu | H01L 31/035236 257/28 |
| 2013/0143336 | A1* | 6/2013 | Jain | H01L 33/0079 438/22 |
| 2014/0014970 | A1* | 1/2014 | Woo et al. | 257/77 |
| 2014/0021446 | A1* | 1/2014 | Lee et al. | 257/29 |
| 2014/0034899 | A1* | 2/2014 | Ahn | H01L 29/06 257/9 |
| 2014/0183736 | A1* | 7/2014 | Cox et al. | 257/741 |
| 2014/0209168 | A1* | 7/2014 | Zhamu | H01L 31/052 136/259 |

OTHER PUBLICATIONS

Chari, T., et al., "Graphite-Graphene Contact Resistance," The Smithsonian/NASA Astrophysics Data System, American Physical Society, APS March Meeting 2013, Mar. 18-22, 2013, p. 1.
Gong, C., et al., "Realistic Metal—Graphene Contact Structures," ACS Nano, Nov. 21, 2013, pp. 642-649, vol. 8, No. 1, American Chemical Society.
Gong, C., et al., "First-principles study of metal-graphene interfaces," Journal of Applied Physics, Dec. 28, 2010, pp. 1-8, vol. 108, Issue 12, American Institute of Physics.

(Continued)

*Primary Examiner* — Phuc Dang
(74) *Attorney, Agent, or Firm* — Slater Matsil, LLP (57) ABSTRACT

An electrical or electronic device is disclosed. In some embodiments, an electrical device includes a single-layer graphene part extending in a lateral direction and a multi-layer graphene structure laterally contacting the single-layer graphene part. The electrical or electronic device further includes a graphite part in contact with a surface of the multi-layer graphene structure. In other embodiments, an electrical device includes a graphene part extending in a lateral direction and a graphite part is configured to provide a lateral contact for the graphene part.

29 Claims, 7 Drawing Sheets

(56) References Cited

OTHER PUBLICATIONS

Kato, T., et al., "Direct Growth of Doping-Density-Controlled Hexagonal Graphene on SiO2 Substrate by Rapid-Heating Plasma CVD," ACS Nano, Sep. 12, 2012, pp. 8508-8515, 6 (10), American Chemical Society.

Lee, Y., et al., "Wafer-Scale Synthesis and Transfer of Graphene Films," Nano Letters, Jan. 4, 2010, pp. 490-493, American Chemical Society.

Liu, W., et al., "A Study on Graphene—Metal Contact," Crystals, 3, Mar. 18, 2013, pp. 257-274.

Nagashio, K., et al., "Intrinsic graphene/metal contact," 2012 IEEE International Electron Devices Meeting (IEDM), Dec. 10-13, 2012, pp. 4.1.1-4.1.4, IEEE, San Francisco, CA.

Smith, J., et al., "Reducing Contact Resistance in Graphene Devices through Contact Area Patterning," ACS Nano, Mar. 8, 2013, pp. 3661-3667, vol. 7, No. 4, American Chemical Society.

Su, C., et al., "Direct Formation of Wafer Scale Graphene Thin Layers on Insulating Substrates by Chemical Vapor Deposition," Nano Letters, Aug. 11, 2011, pp. 3612-3616, American Chemical Society.

\* cited by examiner

ELECTRICAL CONTACT FOR GRAPHENE PART

TECHNICAL FIELD

Embodiments of the present invention relate to an electrical device comprising a single-layer graphene part. Further embodiments of the present invention relate to a method for manufacturing an electrical device. Some embodiments relate to a graphene contact.

BACKGROUND

When manufacturing electrical devices (e.g., transistors) comprising graphene, the contact resistance between graphene and conventional contact electrodes made from metal exhibits high values that may limit the performance of such devices. The high contact resistance may be explained by two mechanisms. The term "electrical device" is meant to comprise electronic devices, as well, such as transistors, diodes, photodetectors, etc.

For metals that do not form a chemical bond with the graphene, the difference of the work functions of graphene ($\Phi$=4.6 eV) and virtually all metals results in an alignment of the Fermi levels and a charge transfer.

For metals that form a chemical bond with graphene, the interaction between the $\pi$-electrons of the graphene and the d-electrons of the metals results in the formation of a bandgap.

SUMMARY OF THE INVENTION

In some embodiments an electrical device comprises a single-layer graphene part extending in a lateral direction, a multi-layer graphene structure laterally contacting the single-layer graphene part, and a graphite part in contact with a surface of the multi-layer graphene structure.

In other embodiments an electrical device comprises a graphene part extending in a lateral direction and a graphite part configured to provide a lateral contact for the graphene part.

In yet other embodiments a method comprises forming a single-layer graphene part on a substrate, forming a multi-layer graphene structure on the substrate laterally adjacent to and contacting the single-layer graphene part, and providing a graphite part contacting a surface of the multi-layer graphene structure.

In further embodiments a method comprises providing a first metal substrate and a second metal substrate laterally neighboring to each other. The method also comprises forming a single-layer graphene part at a surface or an interface of the first metal substrate, forming a multi-layer graphene structure at a surface or an interface of the second metal substrate, and forming a graphite part at a surface of the multi-layer graphene structure.

In various embodiments a method comprises forming a graphene part on a substrate and providing a graphite part on the substrate laterally adjacent to the single-layer graphene part for providing a lateral contact for the graphene part.

Before discussing the present embodiments of the invention in further detail using the drawings, it is pointed out that in the figures, identical elements, elements having the same function or the same effect are provided with the same or similar reference numerals so that the description of these elements and the functionality thereof illustrated in the different embodiments is mutually exchangeable or may be applied to one another in the different embodiments.

DETAILED DESCRIPTION OF ILLUSTRATIVE EMBODIMENTS

Graphene has a number of interesting electrical and optical properties which have sparked intense research since the successful isolation of graphene was first announced in 2004. However, the relatively high contact resistance between graphene and metal conductor lines have so far limited the performance of many designs of electrical devices comprising graphene as a functional part.

Therefore, a need exists for reduced contact resistances of the electrical contacts for a graphene part.

Embodiments of the invention provide a comparatively low contact resistance which can be achieved by using graphite as contact material. Graphite has a work function identical to the work function of undoped graphene. By modifying the graphite (e.g., doping, crystallite size etc.), the work function can also be adjusted to that of doped graphene. The interaction of the $\pi$-electrons of the graphene with the $\pi$-electrons of the graphite consequently does not lead to the formation of a bandgap. Depending on the crystallite size, graphite has a specific resistance in the range from $10^{-6}$ to $10^{-3}$ Ohm cm, i.e., in the range from metals up to doped polysilicon. Thus, the graphite contacts can also be formed as conductor lines and be integrated in a metallization scheme. The contact between graphite and further contacting conductor lines made from metals (e.g., titanium, Ti) behaves like an ohmic resistance and can be implemented in a large-area manner, independent from the transistor channel length, for example.

Figure 1:
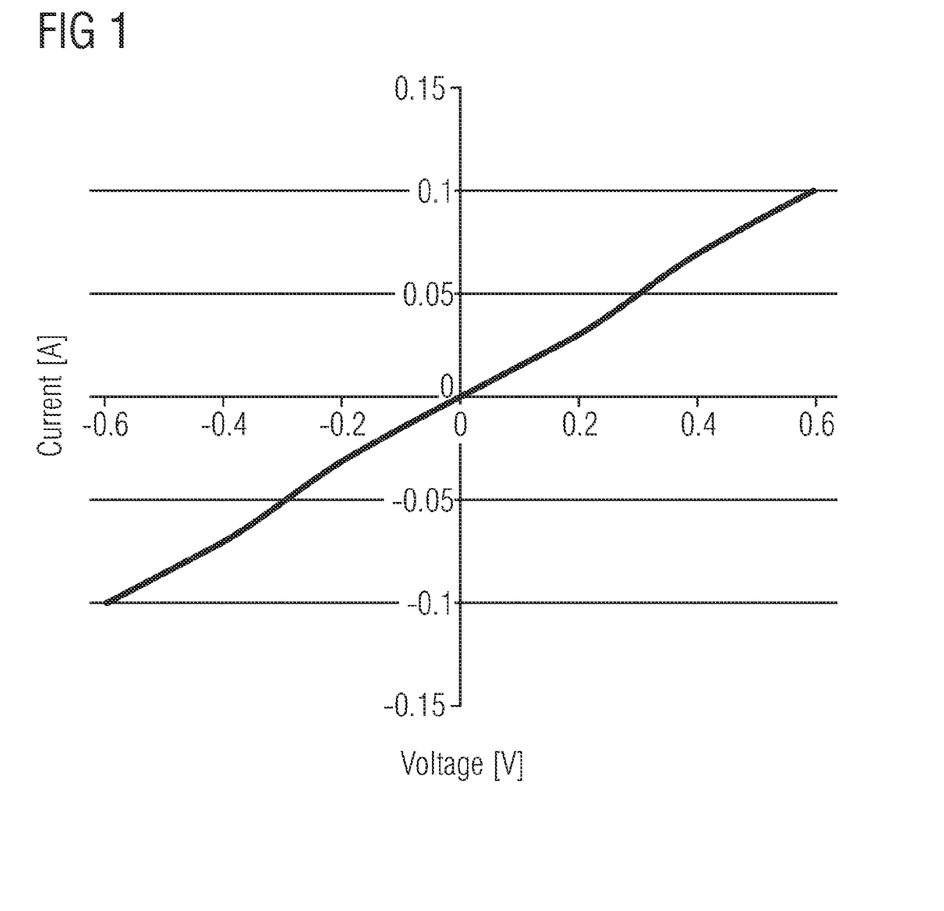
FIG. 1 shows an I/U diagram of a graphite-titanium contact.

FIG. 1 is a I/U characteristic of a graphite-titanium contact. It can be seen that in the voltage range from −0.6 V to +0.6 V the graphite-titanium contact shows a linear behavior.

Embodiments relate to contacting graphene using graphite. Optionally, a transition region of multi-layer graphene can be inserted. This material combination is manufacturable by selective deposition of graphene or multi-layer graphene, respectively, on different metal substrate regions.

FIGS. 2A to 2D illustrate schematically processes for electrically contacting a single-layer graphene part 102 by means of a graphite part 106.

Figure 2A:
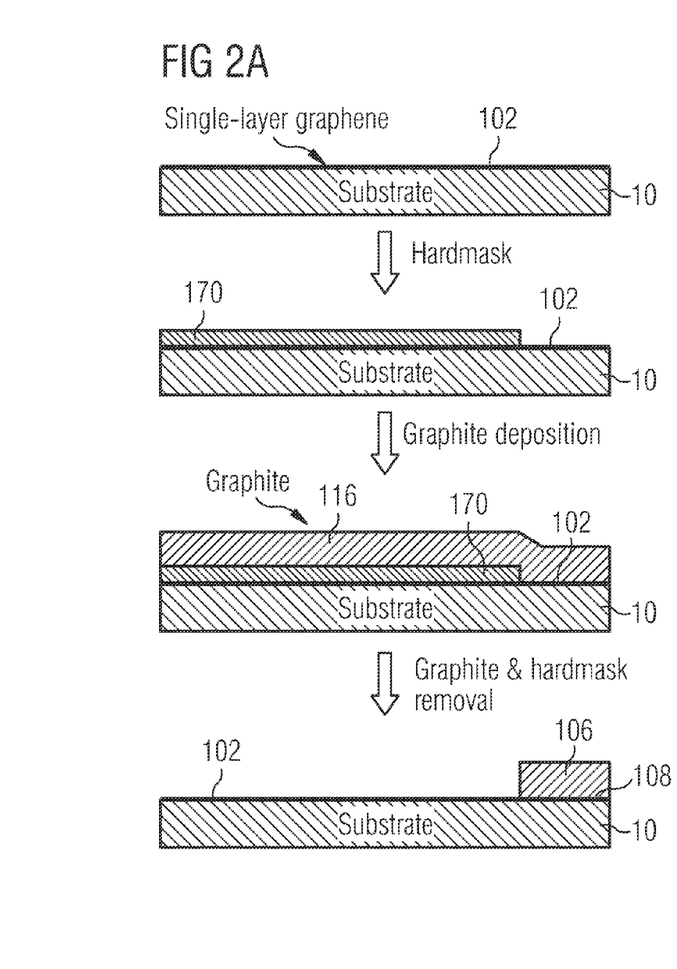
FIG. 2A shows schematic cross sections of an electrical device during different stages of a formation of a graphite contact at a top surface/side of the graphene.

As schematically shown in FIG. 2A, a single-layer graphene part 102 is provided at a main surface of a substrate 10 (for example, at the upper surface of the substrate 10). The single-layer graphene part 102 can be provided by various possible techniques, such as a (physical) transfer from another substrate or by a deposition process (e.g., chemical vapor deposition, CVD). A hardmask 170 may then be formed at a surface of the single-layer graphene part 102. The hardmask 170 may be structured so that it covers a first portion of the surface of the single-layer graphene part 102 and exposes (i.e., does not cover) a second portion of this surface. The second portion of the surface of the single-layer graphene part 102 may be, for example, a portion at an edge of the single-layer graphene part 102. A graphite layer 116 may then be deposited at the exposed surfaces of the hardmask 170 and the single-layer graphene part 102. By removing the hardmask 170, a portion of the deposited graphite layer 116, in particular that portion which covers the hardmask 170, is also removed along with the hardmask 170. The portion of the graphite layer 116 deposited directly on the single-layer graphene part 102 is maintained and forms the graphite part 106. The resulting electrical device is schematically shown in the bottom picture of FIG. 2A. The electrical device comprises the single-layer graphene part 102 extending in a lateral direction. The lateral directions can be understood as defining a plane which is substantially parallel to the main surface of the substrate 10 and also substantially parallel to the orientation of the sheet structure of the single-layer graphene part 102. The electrical device further comprises the graphite part 106 which is in the case of FIG. 2A in contact with the upper surface of the single-layer graphene part 102, more precisely with the second portion of the surface of the single-layer graphene part 102. In this manner, a surface contact or interface contact 108 is formed.

Figure 2B:
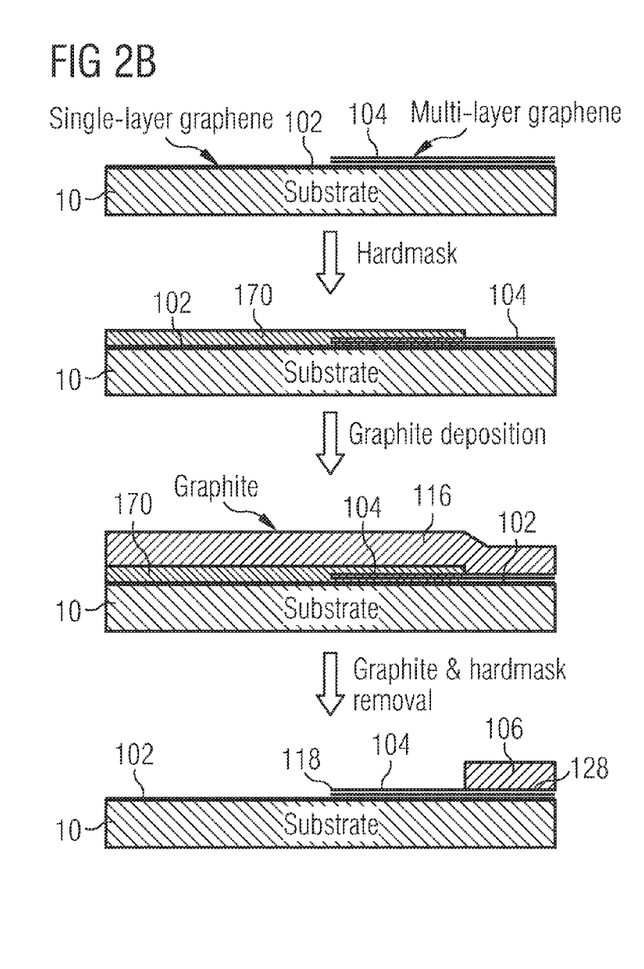
FIG. 2B shows schematic cross sections of an electrical device during different stages of a formation of a graphite contact at a top surface/side of a multi-layer graphene structure, the multi-layer graphene structure contacting a single-layer graphene part.

FIG. 2B shows a similar process as FIG. 2A in which, in addition, a multi-layer graphene structure 104 is provided. As schematically illustrated in the top picture in FIG. 2B, the main surface of the substrate 10 is covered with the single-layer graphene part 102 and adjacent thereto with the multi-layer graphene structure 104. As described above, this may be achieved by a transfer of the single-layer graphene part 102 and the multi-layer graphene structure 104 from another substrate (temporary substrate) or by a deposition process, for example. The hardmask 170 is then formed so that the hardmask 170 covers substantially the entire single-layer graphene part 102 and a portion of the multi-layer graphene structure 104. The graphite layer 116 is then deposited on the hardmask 170 and that portion of the multi-layer graphene structure 104 that was not covered by the hardmask 170. Removal of the hardmask 170 leads to the removal of that portion of the graphite layer 116 that was deposited on the hardmask 170, while another portion of the graphite layer 116 deposited directly on the multi-layer graphene structure 104 is not removed, but preserved, and thus forms the graphite part 106. As schematically shown in the bottom picture of FIG. 2B, the electrical device comprises the single-layer graphene part 102 which extends in a lateral direction. The electrical device further comprises the multi-layer graphene structure 104 that contacts the single-layer graphene part 102 laterally, thus forming a lateral contact 118 between the single-layer graphene part 102 and the multi-layer graphene structure 104. The electrical device also comprises the graphite part 106 which is in contact with a surface of the multi-layer graphene structure 104. As shown in FIG. 2B, the graphite part 106 may be spaced apart from the single-layer graphene part 102 in the lateral direction.

Figure 2C:
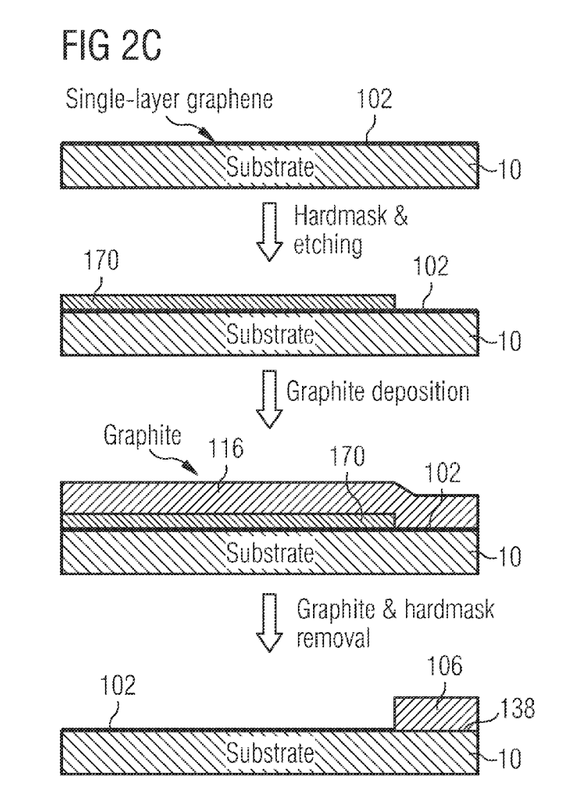
FIG. 2C shows schematic cross sections of an electrical device during different stages of a formation of a lateral graphite contact at a side of the graphene.

FIG. 2C shows a similar process as FIG. 2A in which the graphite part 106 is arranged directly laterally adjacent to the graphene part 102, thereby providing a lateral contact for the graphene part 102. The graphene part 102 may be a single-layer graphene part. As in FIG. 2A, the graphene part 102 is provided at a main surface of the substrate 10 (for example, at the upper surface of the substrate 10). The hardmask 170 may then be formed at a surface of the single-layer graphene part 102. The hardmask 170 may be structured so that it covers a first portion of the surface of the single-layer graphene part 102 and exposes (i.e., does not cover) a second portion of this surface. The second portion of the surface of the single-layer graphene part 102 may be, for example, a portion at an edge of the single-layer graphene part 102. The difference to FIG. 2A in FIG. 2C is that the exposed portion of the single-layer graphene 102 is removed, e.g., by etching. A graphite layer 116 may then be deposited at the exposed surfaces of the hardmask 170 and the substrate 10. By removing the hardmask 170, a portion of the deposited graphite layer 116, in particular that portion which covers the hardmask 170, is also removed along with the hardmask 170. The portion of the graphite layer 116 deposited directly on the substrate 10 is maintained and forms the graphite part 106. The resulting electrical device is schematically shown in the bottom picture of FIG. 2C. The electrical device comprises the single-layer graphene part 102 extending in the lateral direction. The electrical device further comprises the graphite part 106 which the case of FIG. 2C forms a lateral contact 138 with the single-layer graphene part 102.

Figure 2D:
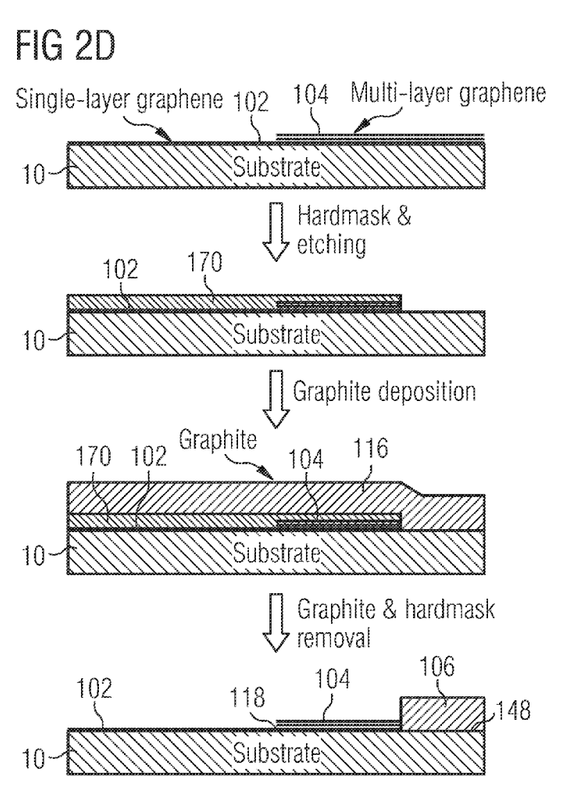
FIG. 2D shows schematic cross sections of an electrical device during different stages of a formation of a lateral graphite contact of a multi-layer graphene structure, the multi-layer graphene structure laterally contacting a single-layer graphene part.

FIG. 2D is similar to FIGS. 2B and 2C. The difference to FIG. 2B is that a portion of the hardmask 170 is removed (e.g., by etching) before the graphite is deposited (similar to FIG. 2C). Therefore, the graphite layer 116 also covers the exposed surface of the substrate 10. After removal of the hardmask, the graphite part 106 at the surface of the substrate 10 is preserved, whereas the remainder of the graphite layer 116 has been removed along with the hardmask 170. A first lateral contact 118 is formed at the (lateral) boundary between the single-layer graphene part 102 and the multi-layer graphene structure 104. A second lateral contact 148 is formed at the (lateral) boundary between the multi-layer graphene structure 104 and the graphite part 106.

Note that in the implementation examples of FIGS. 2C and 2D, the bottom layer of the graphite layer is typically not regarded as graphene. Hence, the bottom layer of the graphite layer differs from the laterally adjacent graphene part. In particular, the graphene part 102 and the graphite part 106 are formed at different times. The formation process which may be used in the implementation examples of FIGS. 2C and 2D, among others, is different to other processes known to the inventors. Also, thermally/CVD grown graphite at the specified temperatures typically does not form well-defined layers ("turbostratic graphite").

According to some possible implementations of the electrical device the multi-layer graphene structure 104 may comprise between 2 and 30 layers of graphene, preferably between 2 and 20, more preferably between 2 and 26 and even more preferably between 2 and 10 layers. One possible distinction between multi-layer graphene and graphite may be that in multi-layer graphene the number of layers can be relatively precisely controlled via process parameters. Furthermore, graphite tends to form crystallites having different spatial orientations of the layers. The multi-layer graphene structure 104 and the graphite part 106 may form an electrical contact for the single-layer graphene part 102. Furthermore, the multi-layer graphene structure 104 may form a transition region between the single-layer graphene part 102 and the graphite part 106.

The single-layer graphene part 102 and the multi-layer graphene structure 104 may be arranged at a surface of the substrate 10. At least a portion of the graphite part 104 may be arranged at a surface of the multi-layer graphene structure 104, said surface being opposite to the substrate 10.

FIGS. 2A and 2B show possible examples of implementation in which the contact can be realized by contacting the single-layer graphene using graphite from the top. In other words, FIGS. 2A and 2B show possible examples of implementation for the manufacturing of a graphite contact at a top of the graphene (single-layer graphene 102 in FIG. 2A, multi-layer graphene 104 in FIG. 2B).

Figure 3A:
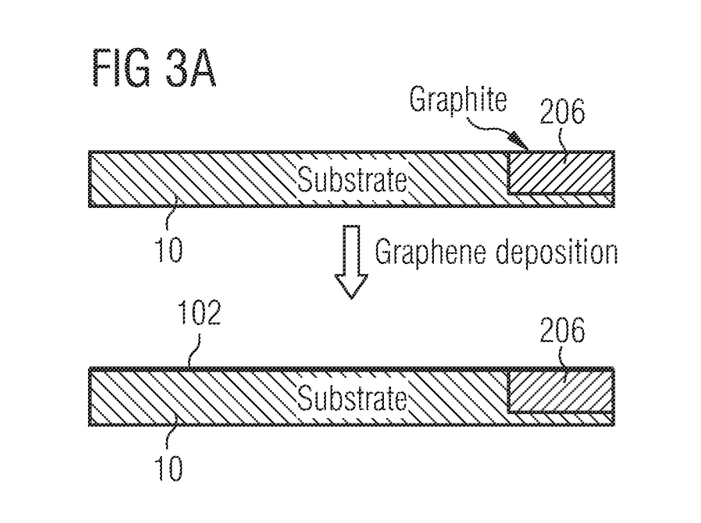
FIG. 3A shows schematic cross sections of an electrical device during different stages of providing a graphite contact at a bottom surface/side of the graphene.
Figure 3B:
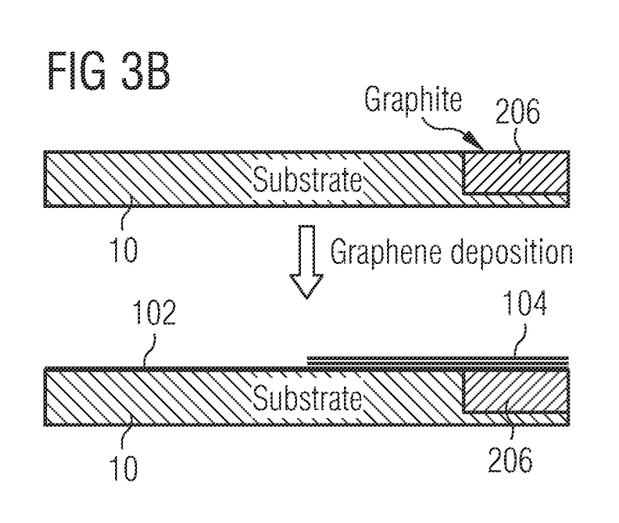
FIG. 3B shows schematic cross sections of an electrical device during different stages of providing a graphite contact at a bottom surface/side of a multi-layer graphene structure, the multi-layer graphene structure contacting a single-layer graphene part.

FIGS. 3A and 3B show alternatives in which the contact can also be manufactured at a lower side of the graphene. The upper pictures in FIGS. 3A and 3B are substantially identical and show the graphite part 206 which is embedded in the substrate 10. According to FIG. 3A the single-layer graphene part 102 is then provided at the surface of the substrate 10 and also in a continuous manner at the surface of the graphite part 206. Note that the surface of the substrate 10 and the surface of the graphite part 206 may typically be substantially flush to each other.

As schematically illustrated in FIG. 3B, the single-layer graphene part 102 and a first portion of the multi-layer graphene structure 104 are arranged at a surface of the substrate. A second portion of the multi-layer graphene structure 104 is in contact with the graphite part 206, e.g., the second portion of the multi-layer graphene structure 104 is arranged at the surface of the graphite part 206.

As mentioned above in connection with FIG. 2B, FIG. 3B also shows that a transition region of multi-layer graphene 104 can be introduced between the single-layer graphene 102 and the graphite electrode 206. This transition region or transition structure can be manufactured, for example, by a selective deposition of single-layer graphene and multi-layer graphene on different metal substrate regions. For example, it is possible to deposit single-layer graphene on Si-doped nickel ($Ni_xSi$) and multi-layer graphene on copper (Cu) by means of a chemical vapor deposition (CVD) with the precursor ethene at 1,000° C. and 100 Pa. Many other suitable combinations of process parameters such as total pressure, precursor partial pressure, precursor type, $H_2$ partial pressure, duration of deposition, metal substrate composition, etc., are possible with this result. The number of deposited graphene layers on a special substrate depends strongly on the process parameters. Typically, a general trend can be observed for Ni to form multi-layer graphene and for Cu to form single-layer graphene, but by adjustment of the process parameters it also can lead to the opposite behavior. For example, in a special case the Ni film was alloyed with Si to partly form $Ni_xSi$ which lowers the carbon solubility in the Ni and helps to produce single-layer graphene. In a similar manner, the second metal may be an alloy, or both the first metal and the second metal may be alloys.

Figure 4A:
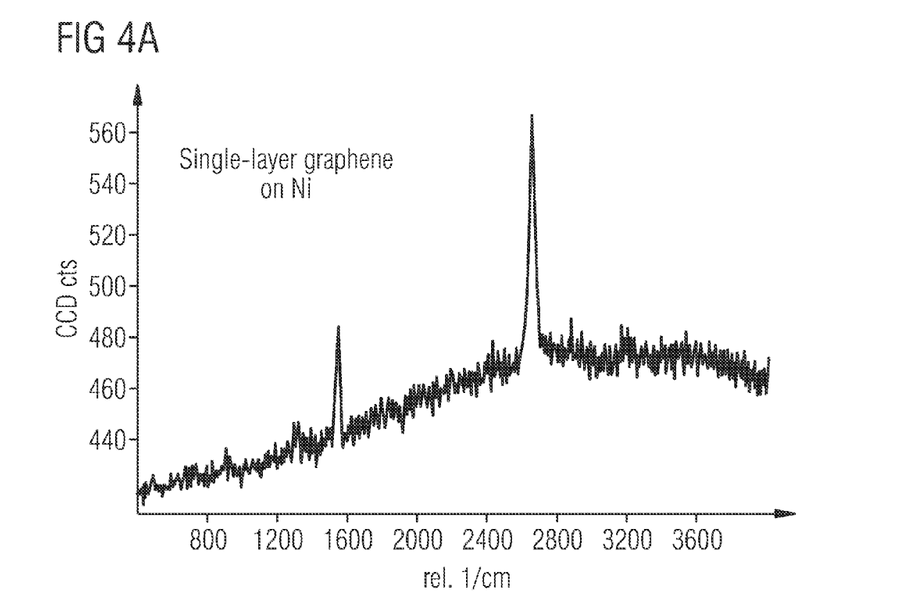
FIGS. 4A and 4B illustrate Raman spectra of simultaneously deposited single-layer graphene (FIG. 4A) and multi-layer graphene (FIG. 4B)
Figure 4B:
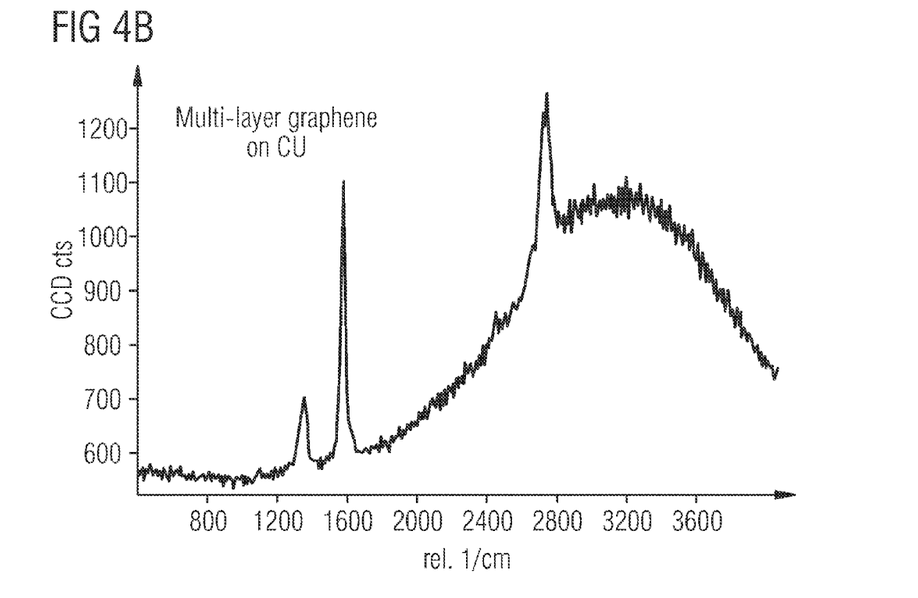

FIGS. 4A and 4B show Raman spectra of single-layer graphene and multi-layer graphene which have been deposited simultaneously on Ni and Cu. The Raman spectra show several typical signals. The most prominent signals are the D-peak at about 1350 $cm^{-1}$, the G-peak at about 1580 $cm^{-1}$ and the 2D-peak at about 2700 $cm^{-1}$. The intensity ratio of the D-peak to the G-peak describes the defectivity of the graphene film. An ideal defect-free graphene film does not show any D-peak. The intensity ratio of the 2D-peak to the G-peak indicates the number of graphene layers. A ratio $I_{2D}/I_G$ of higher than 2 is typical for single-layer graphene. Also a FWHM of the 2D-peak of less than 40 $cm^{-1}$ indicates single-layer graphene, whereas higher FWHM indicates multi-layer graphene. The broad peak at about 3300 $cm^{-1}$ in FIG. 4B is caused by the Cu substrate.

Figure 5:
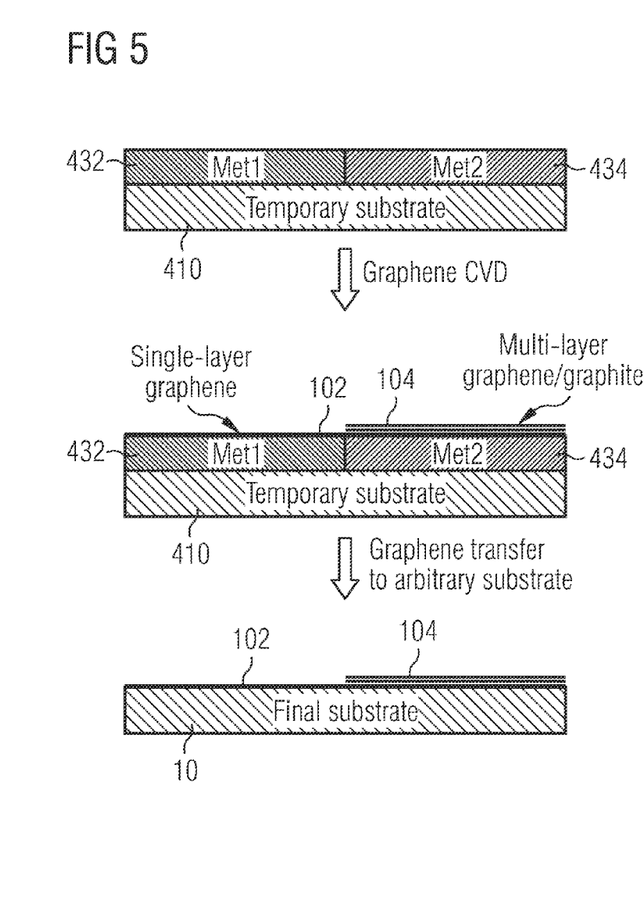
FIG. 5 shows schematic cross sections of forming a single-layer/multi-layer combination structure with transfer onto an arbitrary substrate.

FIG. 5 schematically illustrates the simultaneous formation of single-layer graphene 102 and multi-layer graphene 104 at a first metal substrate 432 and an adjacent second metal substrate 434. The first and second metal substrate 432, 434 may be arranged at a surface of a temporary substrate 410. In other words, a corresponding method for manufacturing comprises providing a surface of a first metal 432 and providing a surface of a second metal 434, that laterally neighbors the surface of the first metal 432. The single-layer graphene part 102 and the multi-layer graphene structure 104 are then deposited concurrently (simultaneously) at the surfaces of the first and second metals 432, 434. The single-layer graphene part 102 is deposited at the surface of the first metal 432 and the multi-layer graphene structure 104 is deposited at the surface of the second metal 434. The single-layer graphene part 102 and the multi-layer graphene structure 104 are then transferred from the temporary substrate 410 to an arbitrary substrate, for example, the final substrate 10. In other words, the single-layer graphene part 102 and the multi-layer graphene structure 104 are formed on the temporary substrate 410 and the method for manufacturing further comprises transferring a combined structure comprising the single-layer graphene part 102 and the multi-layer graphene structure 104 from the temporary substrate 410 to the final substrate 10.

As shown in FIG. 5, the first metal 432 and the second metal 434 are arranged directly adjacent to each other, which is possible if the process parameters (in particular the temperature) of the graphene CVD do not result in the formation of an alloy of the first metal 432 and the second metal 434 at their interface. Such an alloy of the first metal and the second metal might prevent a successful deposition of graphene at the surface of the alloyed portion. In this case an undesired gap could occur between the single-layer graphene part 102 and the multi-layer graphene structure 104. Such a gap might be detrimental to the goal of achieving a low contact resistance for the single-layer graphene part 102.

It is possible to perform wafer-scale, ambient-pressure growth of high-quality graphene films as large as three inches wafer size on Ni and Cu films, followed by instantaneous etching of metal layers and polymer-supported transfer onto arbitrary substrates. This large area synthesis and transfer methods provided improved scalability and processability of graphene films ready for use in wafer scale devices and flexible/stretchable electronics. The main fabrication steps are: Firstly, the three inch $SiO_2$/Si substrates, coded with 300 nanometers thick Ni or 700 nanometer thick Cu are inserted to a tubular quartz tube and then heated up to 1000° C. under ambient pressure with flowing $H_2$ and Ar (or He). After flowing reaction gas mixtures ($CH_4:H_2:HR=250:325:1000$ sccm for Ni and $CH_4:H_2:He=50:15:1000$ sccm for Cu) for approximately five minutes, the sample is rapidly cooled down to room temperature. The average number of graphene layers grown on a Ni catalyst ranged from 3 to 8, depending on the reaction time and cooling rates. On the other hand, the mono- and bi layer graphene grows predominantly on a Cu catalyst. For producing graphene devices in wafer scale, a transfer method can be used that can instantly etch metal layers. The polymer supports such as soft poly(dimethylsiloxane) (PDMS) stamps and thermal-release tapes are attached to the graphene films grown on metal layers. The supports adhered to the substrate are then soaked in water. After a few minutes, the support/graphene/metal layers are detached from $SiO_2$ by water intervening between metal and $SiO_2$. A gentle ultrasonication enhances the penetration rate of water. The separated support/graphene/metal layers are soaked with $FeCl_3$ solution to remove metal layers, and then the resulting graphene film on the polymer support is ready to be transferred onto arbitrary substrates. A transfer printing delivers these films onto a polymer (PET) film or rubber substrate. In order to improve the transfer performance, an additional adhesive layer such as photo curable epoxy films may be helpful. Finally, conventional photolithography and reactive ion etching (RIE) with $O_2$ plasma may be employed to pattern the graphene films for device applications. Alternatively, the graphene on metal/$SiO_2$/Si wafers can be pre-patterned in the same way before detaching and etching of metal layers.

The method schematically illustrated in FIG. 5 can also be regarded as a method for manufacturing an electrical device, wherein the method comprises providing a first metal substrate 432 and a second metal substrate 434. The first metal substrate 432 and the second metal substrate 434 are laterally neighboring to each other. A single-layer graphene part 102 is formed at a surface (or an interface, see FIG. 7) of the first metal substrate 432. A multi-layer graphene structure 104 is formed at a surface (or an interface, see FIG. 7) of the second metal substrate 434. As shown in FIG. 2B, a graphite part 106 is then formed at a surface of the multi-layer graphene structure 104.

Figure 6:
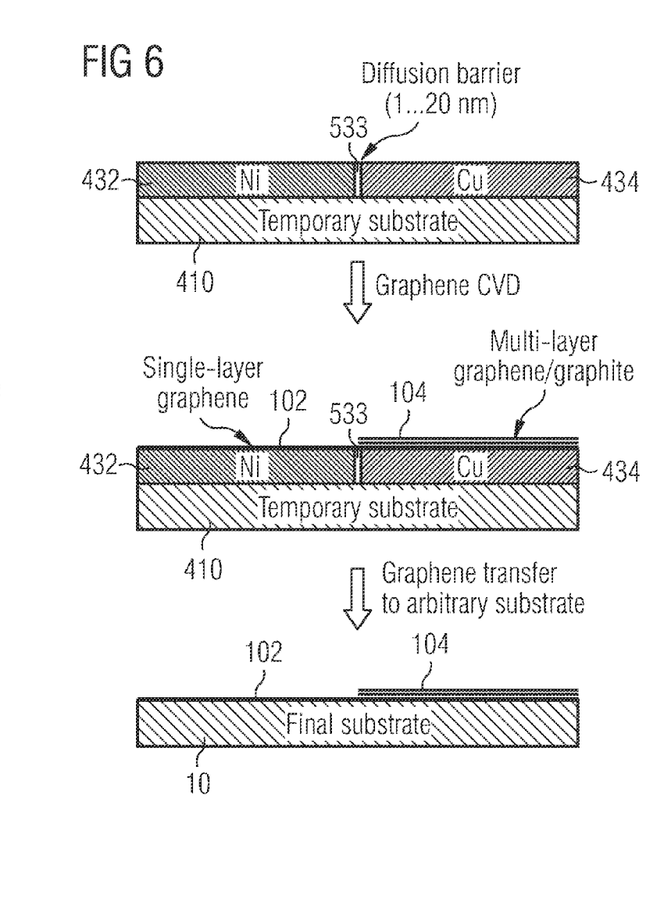
FIG. 6 shows schematic cross sections of forming a single-layer/multi-layer combination structure with transfer onto an arbitrary substrate, wherein a diffusion barrier is provided by between a first metal substrate and a second metal substrate.

FIG. 6 schematically shows how the formation of an alloy of the first metal 432 and the second metal 434 can be prevented, even for situations in which the process parameters could lead to the formation of an alloy of the first metal 432 and the second metal 434 if the first and second metals would have a common interface. As schematically illustrated in FIG. 6, a diffusion barrier 533 is provided between the first metal 432 and the second metal 434. The lateral width of the diffusion barrier, i.e., the width that is separating the first metal 432 from the second metal 434, may range from 1 nm to 20 nm, for example. The diffusion barrier 533 may be structured using so-called spacer technology, for example, which makes it possible to create fine structures in the indicated size range. The diffusion barrier 533 may comprise, e.g., silicon nitride.

When performing the graphene CVD, the relatively narrow width of the diffusion barrier 533 makes it possible for the single-layer graphene part 102 and for the multi-layer graphene structure 104 to extend beyond the edges of the first metal 432 and the second metal 434, respectively. Accordingly, the single-layer graphene part 102 and the multi-layer graphene structure 104 may grow together so that the formation of the above-mentioned gap can be prevented. This growth may be facilitated by metal evaporated from the metal layers 342 or 343. It may also be possible that the material choice for the diffusion barrier 533 facilitates the growth of graphene across the diffusion barrier 533.

The bottom picture in FIG. 6 shows the combined structure of the single-layer graphene part 102 and the multi-layer graphene structure 104 after it has been transferred from the temporary substrate 410 to the final substrate 10.

Figure 7:
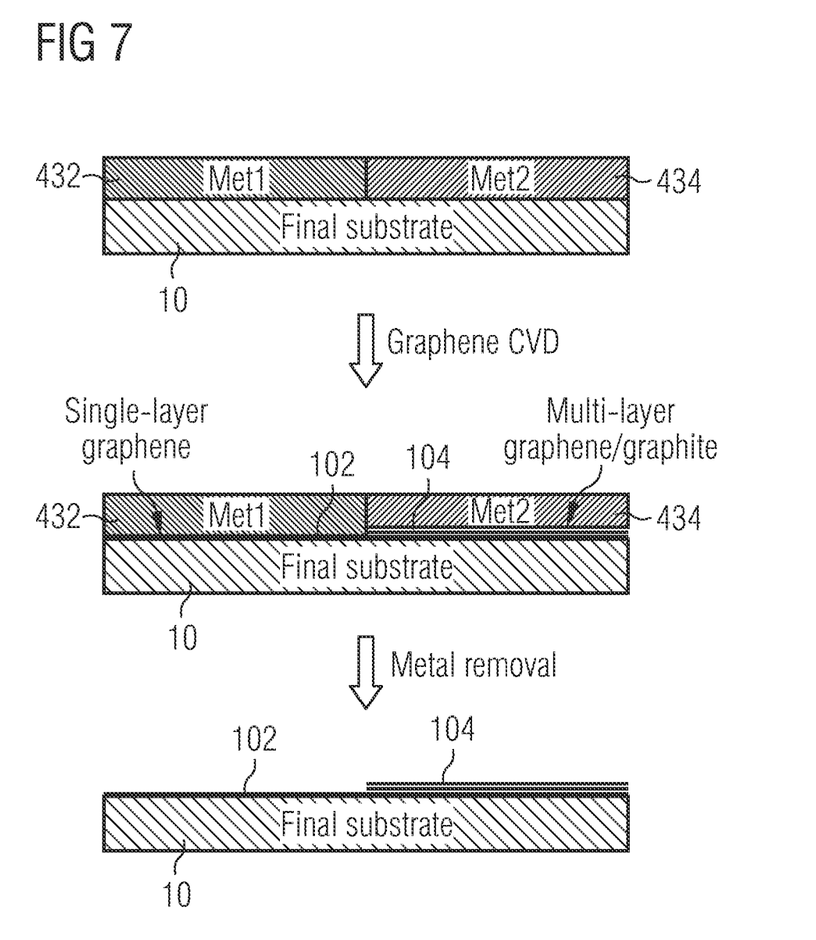
FIG. 7 shows schematic cross sections of forming a single-layer/multi-layer combination structure directly on an arbitrary (final) substrate.

FIG. 7 schematically illustrates an alternative process according to which graphene can be deposited directly on arbitrary substrates by using suitable metal substrates and a suitable process control. The first metal substrate 432 and the second metal substrate 434 are directly provided at a surface of the final substrate 10. As in FIG. 5, the first metal substrate 432 and the second metal substrate 434 are directly adjacent to each other in a lateral direction. Alternatively, it is also possible to provide a diffusion barrier, as schematically illustrated in FIG. 6. Depending on the process parameters of the graphene CVD, the single-layer graphene part 102 and the multi-layer graphene structure 104 may be formed at the interfaces between the first metal 432 and the substrate 10, and between the second metal 434 and the substrate 10, respectively. This behavior may be explained by the diffusion of a sufficient number of carbon atoms through the first and second metals 432, 434. Note that single-layer graphene and/or multi-layer graphene may also be formed at the exposed surfaces of the first and second metals 432, 434; however, these will be removed along with the first and second metals 432, 434 in a subsequent process step, the result of which is shown in the bottom picture of FIG. 7. The method schematically shown in FIG. 7 may be referred to as direct growth of graphene on a substrate (for example, silicon oxide). For example, doping-density-controlled hexagonal graphene can be obtained. The process may make use of rapid-heating plasma CVD. The transfer-free method for growing carrier-density-controlled graphene directly on a $SiO_2$ substrate may be realized by rapid-heating plasma chemical vapor deposition (RH-PCVD). High-quality single-layer graphene sheets with a hexagonal domain can be selectively grown between a Ni film and a $SiO_2$ substrate by using this method. The method relies on a relatively thin Ni layer and rapid heating plasma CVD. A thin Ni film is deposited on a $SiO_2$/Si substrate. Next, a plasma CVD is performed. Carbon atoms diffuse in the Ni film and graphene is preferentially grown along the interface between the Ni and $SiO_2$ layers. By removing the Ni film using a chemical etching technique, graphene on a $SiO_2$/Si substrate is realized. A similar behavior can be expected using copper Cu instead of nickel Ni with the difference that a multi-layer graphene structure is obtained. This direct growth should typically also work with Ni films with implanted C or C layers inserted in the Ni or C mixed into the Ni films (e.g., co-sputtered). At high process temperatures, stress migration and metal evaporation may play a significant role in forming voids in the Cu films. When using relatively thin Cu films (for example, similar to the thickness of Ni films, i.e., <100 nm), it is possible that such a thin Cu film is (completely) transformed to nanoislands, and consequently graphene growth might not be realized. One possible reason for this may be the lower melting point of Cu compared to that of Ni. Another possible reason may be a difference in the diffusion kinetics of Cu and Ni. It appears possible that such problems can be avoided when using relatively thick Cu films (several μm).

According to at least some possible examples of implementation, a method for manufacturing an electrical device may comprise forming a single-layer graphene part 102 on a substrate 10 (or 410). The method may further comprise forming a multi-layer graphene structure 104 on the substrate 10, 410 laterally adjacent to and contacting the single-layer graphene part 102. A graphite part 106, 206 may be provided that contacts a surface of the multi-layer graphene structure 104. The step of providing the graphite part 206 may be performed, according to at least some examples of implementation, prior to forming the single-layer graphene part 102 and the multi-layer graphene structure 104.

The single-layer graphene part 102 and the multi-layer graphene structure 104 may be formed concurrently/simultaneously. The graphite part 106, 206 may be spaced apart from the single-layer graphene part 102 in a direction parallel to an extension of the single-layer graphene part 102.

Providing the graphite part 206 may comprise embedding the graphite part 206 in a substrate 10. The single-layer graphene part 102 and the multi-layer graphene structure 104 may be formed at a surface of the substrate 10 and also at a surface of the graphite part 206 so that the multi-layer graphene structure 104 contacts the graphite part 206. As shown in FIGS. 2A to 3B, the method may further comprise forming a hardmask 170 at a surface of the single-layer graphene part 102 and at a first portion of a surface of the multi-layer graphene structure 104. Graphite 116 may then be deposited at an exposed surface of the hardmask 170 and at a second portion of the surface of the multi-layer graphene structure 104, said second portion not being covered by the hardmask 170. The method may further comprise removing the hardmask 170 and a portion of the graphite 116 that has been deposited at the exposed surface of the hardmask 170, while leaving another portion of the graphite 116 that has been deposited at the second portion of the surface of the multi-layer graphene structure 104.

The single-layer graphene part 102 and the multi-layer graphene structure 104 may be formed on a temporary substrate 410. In this case the method may further comprise transferring a combined structure comprising the single-layer graphene part 102 and the multi-layer graphene structure 104 from the temporary substrate 410 to a final substrate 10.

According to some implementation examples, the diffusion barrier 533 may have a lateral separating width between 1 nm and 20 nm, preferably between 3 nm and 15 nm, and more preferably between 4 nm and 10 nm.

Depositing the single-layer graphene part 102 and the multi-layer graphene structure 104 may comprise a chemical vapor deposition at a temperature between 500 and 1500° C. and a pressure between 50 and 200 Pa. Other possible temperature ranges are between 600 and 1,400° C. or between 700 and 1,300° C., or between 800 and 1,200° C., for example. Other possible pressure ranges are between 60 and 180 Pa, or between 70 and 150 Pa, or between 80 and 130 Pa, for example.

According to further possible implementations, an electrical device may comprise a single-layer graphene part, a graphite part spaced apart from the graphene part, and a multi-layer graphene structure providing a transition region between the single-layer graphene part and the graphite part, wherein the multi-layer graphene structure and the graphite part form an electrical contact for the single layer graphene part.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block, or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the appending patent claims and not by the specific details presented by way of description and explanation of the embodiments herein.

What is claimed is:

1. An electrical device comprising:
   a single-layer graphene part extending in a lateral direction;
   a multi-layer graphene structure laterally contacting the single-layer graphene part; and
   a graphite part in contact with a surface of the multi-layer graphene structure, wherein the graphite part comprises crystallites having different spatial orientations.

2. The electrical device according to claim 1, wherein the graphite part is spaced apart from the single-layer graphene part in the lateral direction.

3. The electrical device according to claim 1, wherein the multi-layer graphene structure and the graphite part form an electrical contact for the single-layer graphene part.

4. The electrical device according to claim 1, wherein multi-layer graphene structure forms a transition region between the single-layer graphene part and the graphite part.

5. The electrical device according to claim 1, further comprising a substrate, wherein the single-layer graphene part and the multi-layer graphene structure are arranged at a surface of the substrate, and wherein at least a portion of the graphite part is arranged at a surface of the multi-layer graphene structure opposite to the substrate.

6. The electrical device according to claim 1, further comprising a substrate, wherein the single-layer graphene part and a first portion of the multi-layer graphene structure are arranged at a surface of the substrate, and wherein the graphite part is embedded in the substrate so that a second portion of the multi-layer graphene structure is in contact with the graphite part.

7. The electrical device according to claim 1, wherein the graphite part comprises a graphite conductor line providing an electrical connection between the electrical device and a further electrical device.

8. An electrical device comprising:
   a graphene part extending in a lateral direction; and
   a graphite part configured to provide a lateral contact for the graphene part, wherein the graphite part comprises crystallites having different spatial orientations.

9. The electrical device according to claim 8, further comprising a multi-layer graphene structure providing a transition contact region between the graphene part and the graphite part, wherein the multi-layer graphene structure and the graphite part form an electrical contact for the graphene part.

10. The electrical device according to claim 9, further comprising a substrate, wherein the graphene part and the multi-layer graphene structure are arranged at a surface of the substrate, and wherein at least a portion of the graphite part is arranged at a surface of the multi-layer graphene structure opposite to the substrate.

11. The electrical device according to claim 10, wherein the graphene part is a single-layer graphene part.

12. The electrical device according to claim 9, further comprising a substrate, wherein the graphene part and a first portion of the multi-layer graphene structure are arranged at a surface of the substrate, and wherein the graphite part is embedded in the substrate so that a second portion of the multi-layer graphene structure is in contact with the graphite part.

13. The electrical device according to claim 8, wherein the graphite part comprises a graphite conductor line providing an electrical connection between the electrical device and a further electrical device.

14. A method for manufacturing an electrical device, the method comprising:
- forming a single-layer graphene part on a substrate;
- forming a multi-layer graphene structure on the substrate laterally adjacent to and contacting the single-layer graphene part; and
- providing a graphite part contacting a surface of the multi-layer graphene structure, wherein the graphite part comprises crystallites having different spatial orientations.

15. The method according to claim 14, wherein the single-layer graphene part and the multi-layer graphene structure are formed concurrently.

16. The method according to claim 14, wherein the graphite part is spaced apart from the single-layer graphene part in a direction parallel to an extension of the single-layer graphene part.

17. The method according to claim 14, wherein providing the graphite part comprises embedding the graphite part in the substrate, and wherein the single-layer graphene part and the multi-layer graphene structure are formed at a surface of the substrate and of the graphite part so that the multi-layer graphene structure contacts the graphite part.

18. The method according to claim 14, further comprising:
- forming a hardmask at a surface of the single-layer graphene part and at a first portion of a surface of the multi-layer graphene structure;
- depositing graphite at an exposed surface of the hardmask and a second portion of the surface of the multi-layer graphene structure, said second portion not being covered by the hardmask; and
- removing the hardmask and a portion of the graphite that has been deposited at the exposed surface of the hardmask, while leaving another portion of the graphite that has been deposited at the second portion of the surface of the multi-layer graphene structure.

19. The method according to claim 14, wherein the single-layer graphene part and the multi-layer graphene structure are formed on a temporary substrate, and wherein the method further comprises:
- transferring a combined structure comprising the single-layer graphene part and the multi-layer graphene structure from the temporary substrate to a final substrate.

20. The method according to claim 14, further comprising:
- providing a surface of a first metal;
- providing a surface of a second metal laterally neighboring the surface of the first metal; and
- concurrently depositing the single-layer graphene part and the multi-layer graphene structure at the surfaces of the first and second metals, wherein the single-layer graphene part is deposited at the surface of the first metal and the multi-layer graphene structure is deposited at the surface of the second metal.

21. The method according to claim 20, wherein the surface of the first metal and the surface of the second metal are separated from each other by a diffusion barrier.

22. The method according to claim 21, wherein the diffusion barrier has a lateral separating width between 1 nm and 20 nm.

23. The method according to claim 20, wherein the surfaces of the first and second metal are interfaces between the first metal and the second metal, respectively, and the substrate, wherein the single-layer graphene part and the multi-layer graphene structure, respectively, are formed at the interfaces between the first metal or the second metal, respectively, and the substrate, and wherein the method further comprises removing the first metal and the second metal.

24. The method according to claim 20, wherein depositing the single-layer graphene part and the multi-layer graphene structure comprises a chemical vapor deposition at a temperature between 500 and 1,500 degrees Celsius and a pressure between 50 and 200 Pa.

25. The method according to claim 24, wherein ethene is used as a precursor in the chemical vapor deposition.

26. The method according to claim 20, wherein the first metal is nickel and the second metal is copper.

27. The method according to claim 20, wherein the first metal is one of an alloy and a nickel-silicon alloy.

28. A method for manufacturing an electrical device, the method comprising:
- providing a first metal substrate and a second metal substrate laterally neighboring to each other;
- forming a single-layer graphene part at a surface or an interface of the first metal substrate;
- forming a multi-layer graphene structure at a surface or an interface of the second metal substrate; and
- forming a graphite part at a surface of the multi-layer graphene structure.

29. A method for manufacturing an electrical device, the method comprising:
- forming a graphene part on a substrate; and
- providing a graphite part on the substrate laterally adjacent to the graphene part for providing a lateral contact for the graphene part, wherein the graphite part comprises crystallites having different spatial orientations.

* * * * *